United States Patent

Patten, Jr. et al.

[11] Patent Number: 6,099,652
[45] Date of Patent: Aug. 8, 2000

[54] APPARATUS AND METHOD FOR DEPOSITING A SUBSTANCE WITH TEMPERATURE CONTROL

[75] Inventors: Donald O. Patten, Jr., Sterling; Matthew A. Simpson, Sudbury; Henry Windischmann, Northboro, all of Mass.; Michael S. Heuser, Foothill Ranch, Calif.; William A. Quirk; Stephen M. Jaffe, both of Lake Forest, Calif.

[73] Assignee: Saint-Gobain Industrial Ceramics, Inc., Worcester, Mass.

[21] Appl. No.: 08/863,763

[22] Filed: May 27, 1997

Related U.S. Application Data

[62] Division of application No. 08/480,580, Jun. 7, 1995, Pat. No. 5,679,404.

[51] Int. Cl.$^7$ ............................. C23C 16/00; F28F 7/00
[52] U.S. Cl. ........................ 118/724; 118/728; 118/500; 165/80.1
[58] Field of Search .................................. 118/724, 728, 118/500; 204/298.09, 298.15; 165/80.1, 80.2

[56] References Cited

U.S. PATENT DOCUMENTS

| | | | |
|---|---|---|---|
| 3,845,739 | 11/1974 | Erhart et al. | 118/49.1 |
| 4,401,054 | 8/1983 | Matsuo et al. | 118/723 |
| 4,457,259 | 7/1984 | Holden | 165/80 C |
| 4,471,003 | 9/1984 | Cann | 427/34 |
| 4,487,162 | 12/1984 | Cann | 118/723 |
| 4,505,947 | 3/1985 | Vukanovic et al. | 427/34 |
| 4,507,588 | 3/1985 | Asmussen et al. | 315/39 |
| 4,527,620 | 7/1985 | Pedersen et al. | 165/80 D |
| 4,585,668 | 4/1986 | Asmussen et al. | 427/38 |
| 4,596,718 | 6/1986 | Gruner | 427/34 |
| 4,630,566 | 12/1986 | Asmussen et al. | 118/50.1 |
| 4,691,662 | 9/1987 | Roppel et al. | 118/50.1 |
| 4,728,863 | 3/1988 | Wertheimer | 315/111.21 |
| 4,913,090 | 4/1990 | Harada et al. | 118/724 |
| 4,949,783 | 8/1990 | Lakios et al. | 165/80.1 |
| 4,979,466 | 12/1990 | Nishitani et al. | 118/722 |
| 4,987,002 | 1/1991 | Sakamoto et al. | 427/34 |
| 4,999,320 | 3/1991 | Douglas | 427/225 |
| 5,063,031 | 11/1991 | Sato | 422/245 |
| 5,068,871 | 11/1991 | Uchida et al. | 373/17 |
| 5,094,878 | 3/1992 | Yamamoto et al. | 427/37 |
| 5,104,634 | 4/1992 | Calcote | 423/446 |
| 5,108,779 | 4/1992 | Gasworth | 427/39 |
| 5,132,105 | 7/1992 | Remo | 423/446 |
| 5,204,144 | 4/1993 | Cann et al. | 427/569 |
| 5,204,145 | 4/1993 | Gasworth | 427/577 |
| 5,226,383 | 7/1993 | Bhat | 118/730 |
| 5,314,570 | 5/1994 | Ikegaya et al. | 117/103 |
| 5,318,801 | 6/1994 | Snail et al. | 427/248.1 |
| 5,340,401 | 8/1994 | Cann | 118/725 |

(List continued on next page.)

FOREIGN PATENT DOCUMENTS

| | | |
|---|---|---|
| 0 451 740 A2 | 10/1991 | European Pat. Off. . |
| 0 465 185 A1 | 1/1992 | European Pat. Off. . |
| 0 467 390 A1 | 1/1992 | European Pat. Off. . |
| 59-21026 | 2/1984 | Japan . |
| 59-43861 | 3/1984 | Japan . |
| 63-289926 | 11/1988 | Japan . |
| 1-242141 | 9/1989 | Japan . |
| 1-312008 | 12/1989 | Japan . |
| 2-60103 | 2/1990 | Japan . |
| 2-167891 | 6/1990 | Japan . |

*Primary Examiner*—Jeffrie R Lund
*Attorney, Agent, or Firm*—Volker R. Ulbrich

[57] ABSTRACT

An apparatus for depositing synthetic diamond on a surface of a substrate includes a deposition chamber and a cooling block having a surface in the deposition chamber that is cooled by heat exchange. The substrate is supported from the cooling block so that the bottom surface of the substrate is spaced from the cooling block surface by a gap, and a gas is provided in the deposition chamber and in the gap, the gas comprising at least 30 percent hydrogen gas. A plasma deposition system forms in the chamber a plasma containing hydrogen gas and a hydrocarbon gas for depositing synthetic diamond on the top surface of the substrate.

15 Claims, 8 Drawing Sheets

U.S. PATENT DOCUMENTS

| | | | |
|---|---|---|---|
| 5,342,660 | 8/1994 | Cann et al. | 427/577 |
| 5,376,180 | 12/1994 | Mahler | 118/728 |
| 5,411,076 | 5/1995 | Matsunaga et al. | 165/80.2 |
| 5,488,774 | 2/1996 | Janowski | 30/346.53 |
| 5,527,392 | 6/1996 | Snail et al. | 118/725 |
| 5,551,983 | 9/1996 | Shepard et al. | 118/723 R |
| 5,567,267 | 10/1996 | Kazama et al. | 156/345 |
| 5,595,241 | 1/1997 | Jelinek | 165/80.1 |
| 5,679,404 | 10/1997 | Patten et al. | 427/248.1 |
| 5,738,165 | 4/1998 | Imai | 165/80.2 |
| 5,792,304 | 8/1998 | Tamura et al. | 156/345 |
| 5,803,977 | 9/1998 | Tepman et al. | 118/728 |
| 5,822,172 | 10/1998 | White | 361/234 |

APPARATUS AND METHOD FOR DEPOSITING A SUBSTANCE WITH TEMPERATURE CONTROL

This is a divisional of application Ser. No. 08/480,580 filed on Jun. 7, 1995, now U.S. Pat. No. 5,679,404.

FIELD OF THE INVENTION

This invention relates to temperature control during material deposition and, more particularly, to obtaining uniform and repeatable temperature conditions when depositing a substance on a substrate. The invention is especially applicable to deposition of diamond by plasma jet.

BACKGROUND OF THE INVENTION

Techniques have long been known for depositing substances, such as layers of semiconductor material, using a plasma that is formed into a jet. For example, U.S. Pat. Nos. 4,471,003 and 4,487,162 disclose arc jet plasma deposition equipments which utilize a plasma for deposition of semiconductors and other materials. Ions and electrons are obtained by injecting an appropriate compound, such as a silicon compound, into an arc region, and a jet (or beam) is formed by utilizing magnetic fields to control the plasma. Recently, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes. A plasma of a hydrocarbon and hydrogen can be obtained using electrical arcing, and the resultant plasma directed toward a substrate, so that polycrystalline diamond film is deposited on the substrate. Reference can be made, for example, to U.S. Pat. No. 5,204,144 for description of an example of a type of plasma jet deposition that can be utilized to deposit synthetic diamond on a substrate.

In various commercial applications it is desirable to have relatively large size diamond films. In plasma jet deposition techniques there are various factors which limit the practical size of the deposition area that is active on a substrate at a particular moment. For example, when an arc is employed to generate the heated gas mixture in an arc jet plasma deposition system, the diameter of the beam can be limited by a number of factors. Since the cross-section of the plasma beam is generally limited in practical applications, the area on which it is desired to deposit a diamond film may be larger than the deposition beam. This means that it may be desirable to move the beam and the target substrate with respect to each other during the deposition process. This has been achieved by spinning the substrate during deposition, which helps to promote temperature and diamond quality uniformity over the substrate, as well as to attain larger area substrate coverage (see e.g. the referenced U.S. Pat. No. 5,204,144).

In plasma jet deposition of the type described, it is generally necessary to cool the substrate (or mandrel) upon which the diamond is being deposited, to prevent the hot plasma from overheating the deposition surface, and to provide an optimum deposition temperature for the particular product characteristics desired. A coolant can be circulated in the mandrel to provide cooling. In a rotating mandrel type of deposition equipment, as described in U.S. Pat. No. 5,204,144, cooling fluid can be circulated through a rotating union. In copending U.S. patent application Ser. No. 08/175, 586, now U.S. Pat. No. 5,486,380, assigned to an assignee of the present Application, there is disclosed a cooling arrangement for a rotating mandrel assembly in which the mandrel has extending radiator fins that interleave with stationary receptor fins which are water cooled. In an embodiment of the copending Application, heat transfer between the radiator and receptor fins can be modified by changing the gas between radiator and receptor fins to change the thermal conductivity therebetween.

In U.S. Pat. No. 5,204,125 there is disclosed CVD plasma torch diamond deposition on rotating substrates in an environment of hydrogen and inert gas. Cooling plates, which do not rotate, are provided, and each cooling plate can be brought closer or further from a substrate to maintain the substrate at a set temperature.

In plasma CVD deposition of diamond film on the surface of a substrate disc, it is typical to employ a spacer between the underside of the substrate and a cooling block (or cooled mandrel) that is used to cool the substrate which receives a high heat flux from the hot plasma beam. The spacer, which may be, for example, a graphite disc, facilitates the temperature transition between the bottom of the substrate (which may be, for example, at a temperature in the range 500 to 1100 degrees C) and the top surface of the cooling block (which may be, for example, at a temperature in the range 10 to 500 degrees C). Typically, the substrate, spacer, and cooling block are held together by bolting or clamping, and the composite thermal conductivity through these components is quite sensitive to the relative surface contours of the components and to the pressure with which the surfaces are pressed together. Non-uniformity of contact and/or pressure can lead to substantial temperature differences at the deposition surface which, in turn, can degrade the uniformity and quality of the diamond film being deposited. Also, if contact and/or pressure changes when a new substrate is put in place, the substrate temperature will be different during deposition. The resultant lack of repeatable deposition conditions can also tend to degrade the overall quality of the diamond film being produced.

One of the disadvantages of requiring a relatively uniform pressure on the substrate/spacer/mandrel sandwich is that each time a new substrate is mounted, it is necessary to adjust the bolting or clamping to obtain the desired pressure uniformity. The deposition chamber operates at low pressure, and it takes considerable time for the vacuum pumping system to reestablish the appropriate pressure before deposition can be initiated on the newly mounted substrate. It would be advantageous to be able to change substrates within the deposition chamber without breaking vacuum (such as by using a robot arm), but the need for securing the substrate and the spacer to the cooling block with precision renders the task more difficult.

It is among the objects of the present invention to provide an improved apparatus and technique for temperature control of a substrate in a deposition system, such as for deposition of diamond film by CVD plasma jet.

SUMMARY OF THE INVENTION

In accordance with an embodiment of the method of the invention, there is disclosed a technique for depositing a substance on a surface of a substrate, including the following steps: providing a cooling block having a surface that is cooled by heat exchange; supporting the substrate from the cooling block so that the bottom surface of the substrate is spaced from the cooling block surface by a gap; providing a gas in the gap; and depositing said substance on the top surface of the substrate. [Reference to deposition on the top surface of the substrate includes deposition on the substrate itself, as well as deposition on any layers over the substrate.]

In an embodiment of the invention, at least 30 percent of the gas in the gap is hydrogen, and the size of the gap is in the range 0.01 centimeters to 0.30 centimeters. Preferably, at least 80 percent of the bottom surface of the substrate is spaced from and opposes the cooling block by the gap standoff.

The technique hereof is particularly advantageous for deposition of diamond film by CVD plasma deposition in a deposition chamber containing at least 30 percent hydrogen. Typically, although not necessarily, the deposition chamber environment will be mostly hydrogen gas.

The majority of the heat flowing from the substrate passes by thermal conduction across the gas gap. By providing a fixed and repeatable gas gap, which can be utilized for a succession of substrates, uniform and repeatable temperature conditions at the substrate deposition surface are more easily attainable, since there is no longer reliance on providing uniform and repeatable surface contact and pressure between a substrate, a solid spacer, and a cooling block. The technique hereof also greatly facilitates operation with a mechanical (or robot) arm within the chamber without the need for breaking vacuum to secure a new substrate in place, since the substrate can be positioned without the requirement for precise clamping or bolting pressure. In some configurations, no bolting or clamping is even necessary.

Further features and advantages of the invention will become more readily apparent from the following detailed description when taken in conjunction with the accompanying drawings.

DETAILED DESCRIPTION

Figure 1:
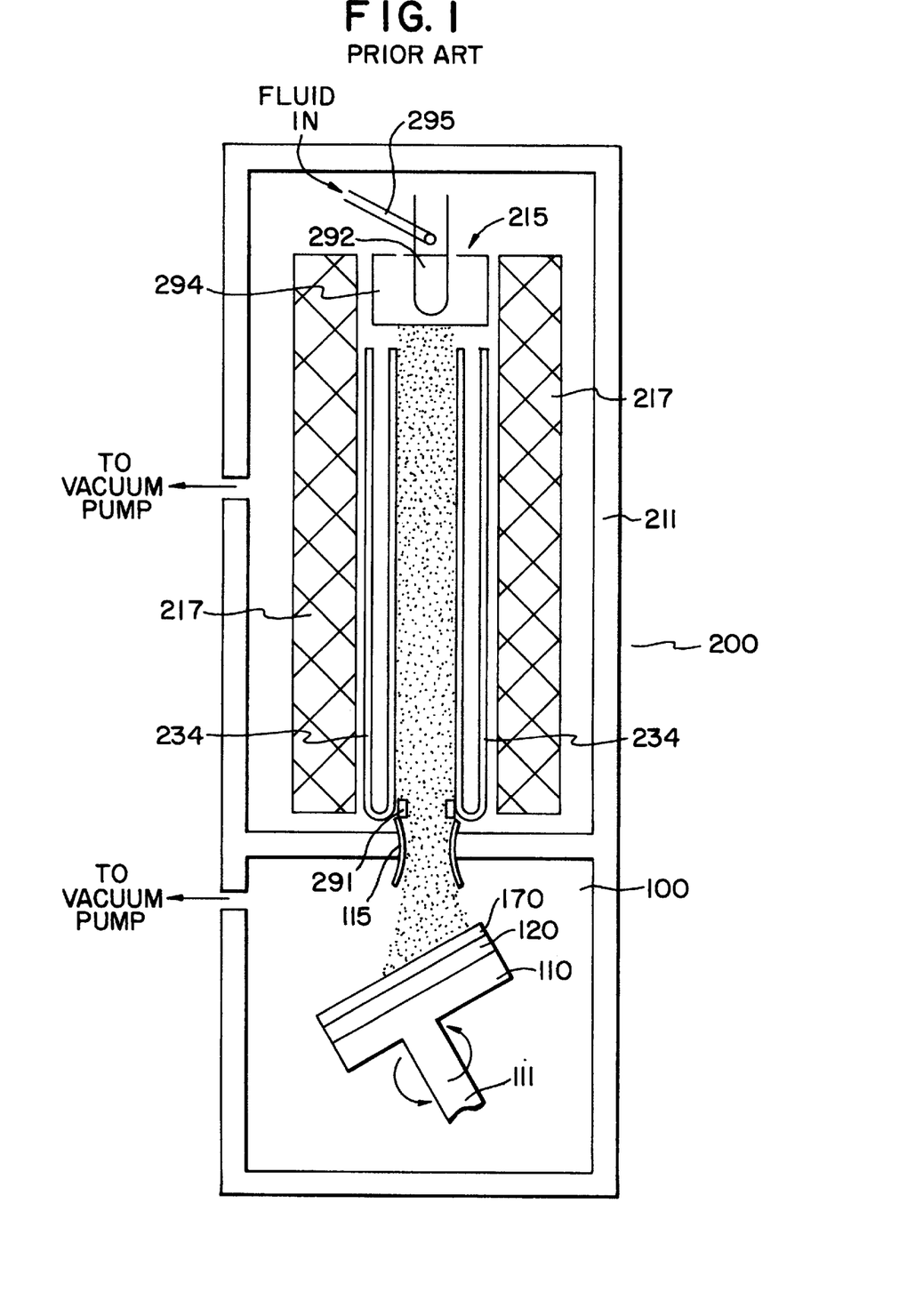
FIG. 1 is a schematic diagram, partially in block form, of a prior art apparatus in which the improvements of the invention can be utilized.

Referring to FIG. 1, there is shown a prior art chemical vapor deposition ("CVD") apparatus of a type in which the improvements of the invention can be utilized. A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated system, where synthetic diamond is to be deposited, the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and directed toward the deposition region at which a substrate is located. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including, for example, other types of CVD deposition equipment, or physical vapor deposition equipment, can be used in conjunction with the features of the invention to be described.

Figure 2:
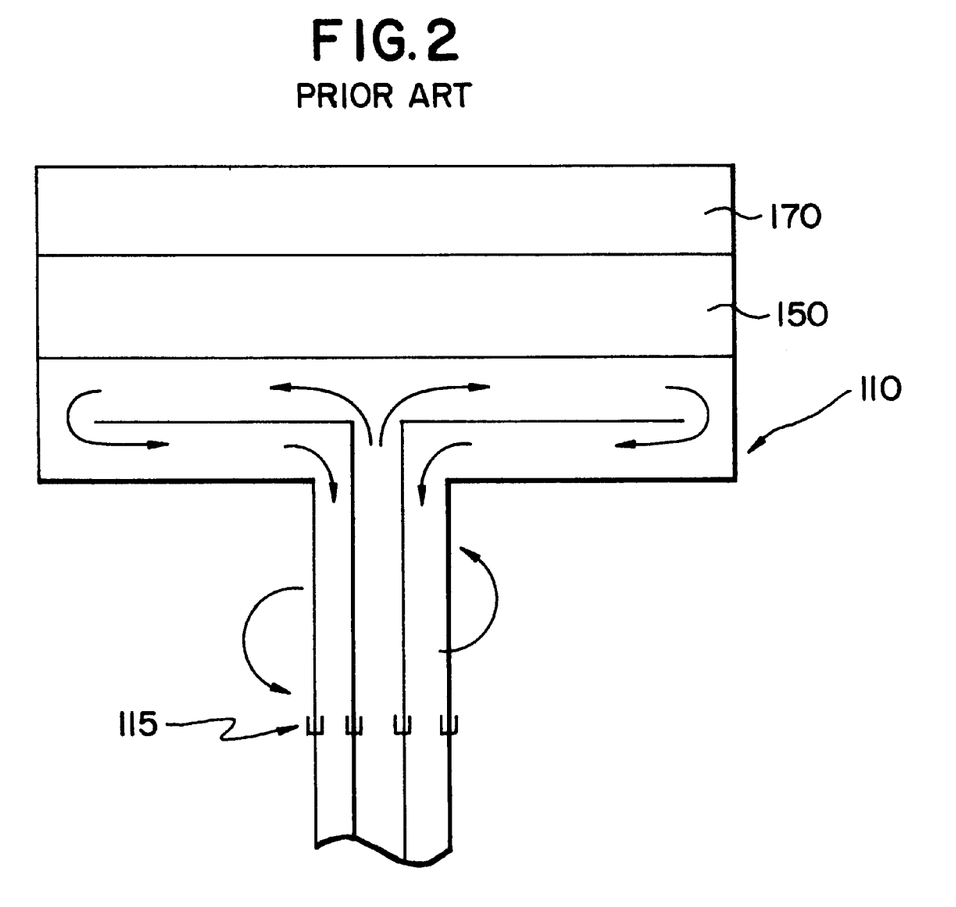
FIG. 2 is a simplified cross-sectional diagram which illustrates a prior art rotating mandrel assembly with heat exchange.

In the prior art arrangement of FIG. 1, a mandrel 110 is rotatable on a shaft 111, and has a spacer 120 and a substrate 170 mounted thereon (by means not shown, bolting or clamping being typical). The mandrel 110 is a cooling block that can be cooled by any suitable means, for example by using a heat exchange fluid (e.g. water) that is circulated through the block or through another component in thermal contact with the block. A prior art arrangement is shown in FIG. 2, where a rotatable cooling block 110, coupled with a rotary union 115, is rotated, such as by a belt or gear drive (not shown), and coolant fluid can be circulated through the cooling block, in the direction indicated by the arrows, or in the opposite direction. The cooling block can be tilted with respect to the direction of the plasma jet, as disclosed in U.S. Pat. No. 5,342,660, and a suitable motor (not shown) can be used for rotating the shaft, as is also disclosed in U.S. Pat. No. 5,342,660. The rotational drive will conventionally be above the rotary union. The disclosed embodiments hereof can operate on a cooling block which is rotatable, as shown, or which is stationary.

Figure 3:
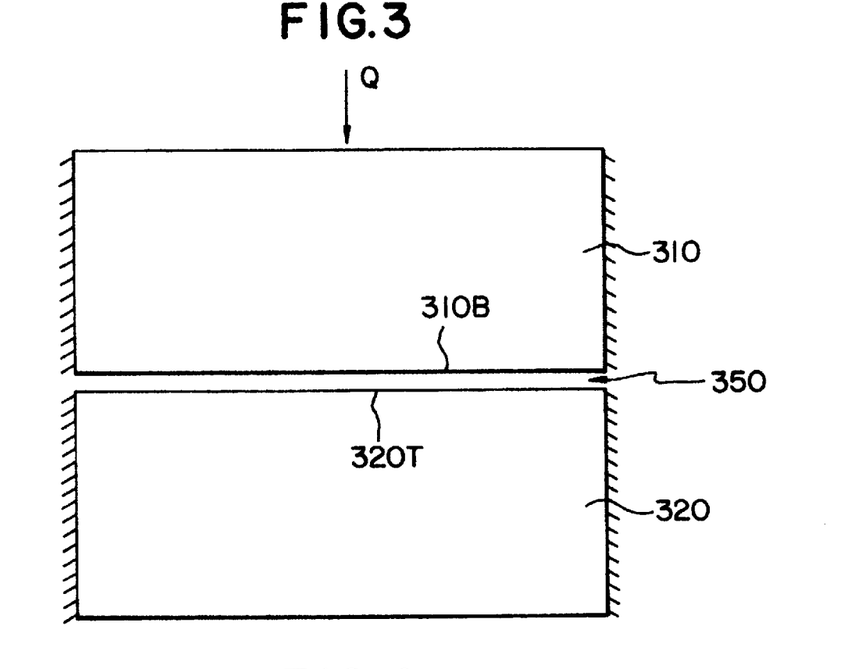
FIG. 3 is a cross-section of a model of a substrate and a cooling block separated by a gap.
Figure 4:
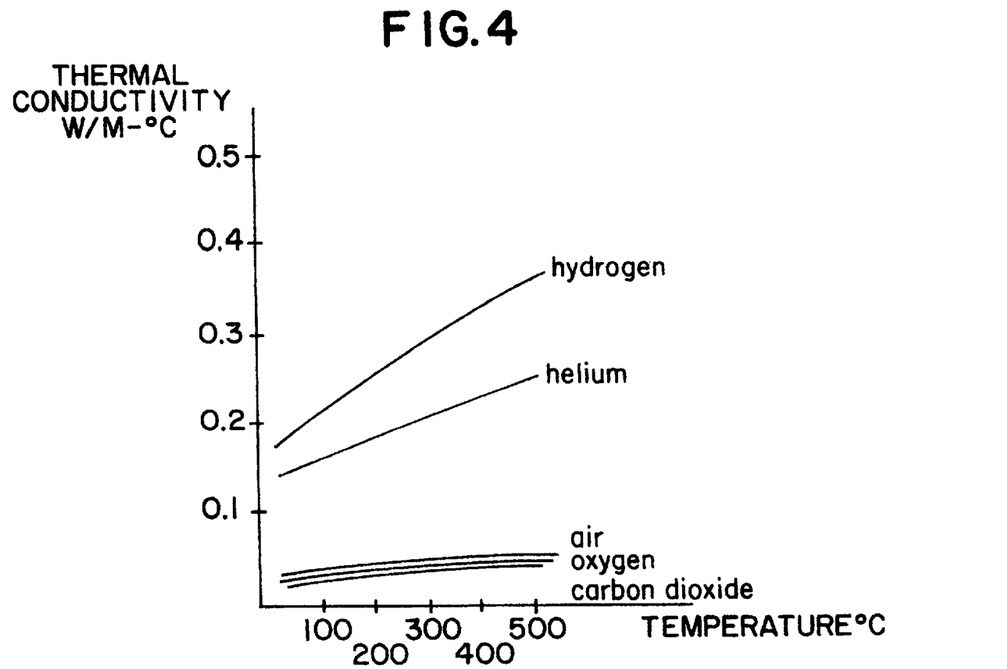
FIG. 4 shows graphs of thermal conductivity as a function of temperature for hydrogen, helium, oxygen, carbon dioxide, and air.

Consider the arrangement shown in FIG. 3 which shows a substrate 310 having its bottom surface 310B spaced from the top surface 320T of the cooling block 320 by a hydrogen gas containing gap 350. The conduction across the gap can be modeled by the one dimensional heat transfer equation $$Q/A = k(\partial T/\partial x) \qquad (1)$$

where Q is the heat flux into the substrate, in Watts, A is the area in $cm^2$, k is the thermal conductivity of the gap, in Watts/cm/° C., T is temperature in degrees C, and x is the dimension across the gap, in cm. Equation (1) indicates that the heat flow proceeds by conduction, rather than radiation or convention. Assuming that temperature varies approximately linearly across the gap, equation (1) can be written as $$Q/A = k(\Delta T/\Delta x) \qquad (2)$$

where $\Delta T$ is the temperature differential across the gap, and $\Delta x$ is the gap width (i.e., the distance between surfaces 320T and 310B). Thus, for a particular heat flux per unit area of substrate, a particular operating temperature differential across the gap, and a particular thermal conductivity for the substance in the gap, equation (2) can be used to compute the gap width that will handle the heat flux at the specified operating temperature differential. FIG. 4 shows the thermal conductivity of hydrogen, helium, oxygen, carbon dioxide, and air as a function of temperature. The curve values are approximately applicable over a range of operating pressures between 0.05 atmospheres and 10 atmospheres. Assume that for one example of CVD arc jet plasma deposition the substrate back surface temperature is 700 degrees C and the cooling block surface temperature is 100 degrees C. The average temperature in the gap is about 400 degrees C and, at this temperature, FIG. 4 shows that the thermal conductivity of hydrogen is about 0.0033 Watts/cm-° C. If the heat flux from the plasma beam is approximately 30 Watts/$cm^2$, the required gap dimension can be computed from equation (2) as:

$$30 = 0.0033(600/\Delta x)$$

$$\Delta x \approx 0.07 \text{ cm}$$

In a further example, the CVD arc jet plasma deposition operates with a heat flux of 50 Watts/$cm^2$, a substrate back surface temperature at 1000 degrees C, and a cooling block surface temperature of 125 degrees C. In this example the average temperature in the gap is about 560 degrees and, at this temperature, FIG. 4 shows that the thermal conductivity of hydrogen is about 0.0039 Watts/cm-° C. so we have from equation (2):

$$50 = 0.0039(875/\Delta x)$$

$$\Delta x \approx = 0.07 \text{ cm}$$

Accordingly, it is seen that a hydrogen containing gap of about 0.07 cm is suitable for the conditions of these examples. In general, a gap range of 0.01 cm to 0.30 cm is preferred in covering a range of operating conditions with at least 30 percent hydrogen in the gas gap. If the gap is too small, there can be difficulty in maintaining the correct standoff over the entire substrate area. For most of the embodiments hereof, the gas in the gap will be substantially the same as the gas environment in the deposition chamber although a gas may be injected into and/or confined in the gap.

Figure 5:
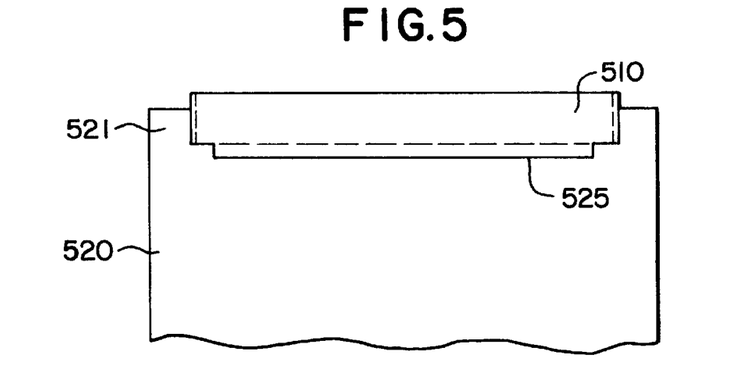
FIG. 5 shows a cross-section of an arrangement of cooling block, substrate, and gas gap in accordance with an embodiment of the invention.

In the embodiment of FIG. 5, the cooling block 520 has a two-tiered annular shoulder 521 for supporting a disc-shaped substrate 510 above the cooling block top surface 525. The substrate can be any suitable material, for example, silicon. The structure 521 can be integral with the cooling block, or a separate unit as in some of the embodiments below.

Figure 6:
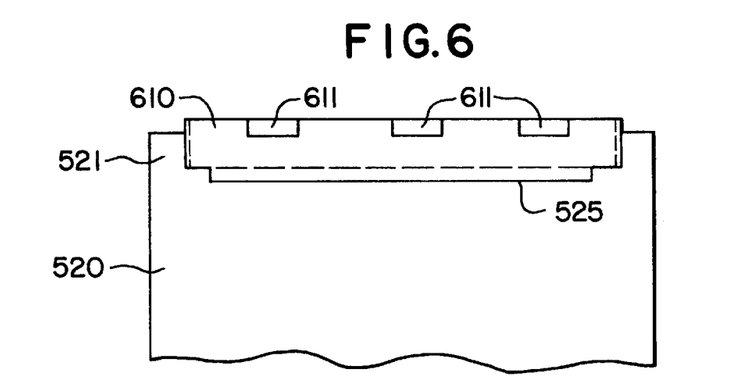
FIGS. 6 and 7 show a further embodiment of the invention wherein a substrate holder is employed in spaced relation to the cooling block, and the cross-section of FIG. 6 is a section taken through a plane represented by the arrows 6—6 in FIG. 7.
Figure 7:
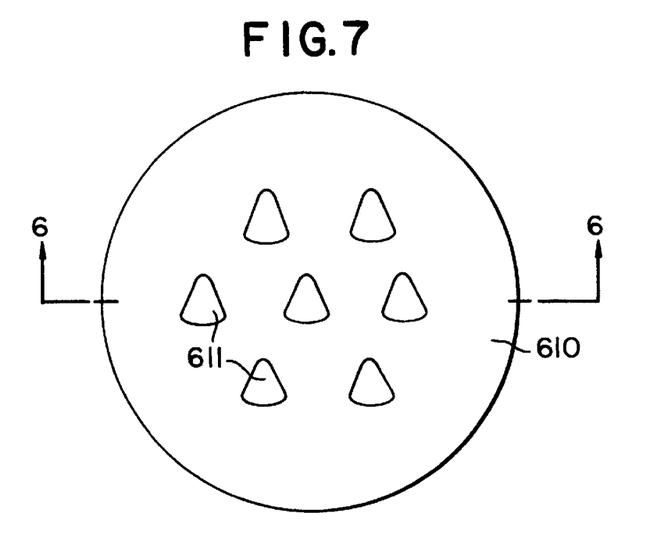

In the embodiment of FIG. 6, the cooling block 520 and its two-tiered annular support is similar to that of FIG. 5. However, in this embodiment, instead of providing a disc-shaped substrate across the gap from the cooling block top surface, a disc-shaped substrate holder 610 is utilized. The substrate holder can be formed of any suitable material, for example, molybdenum. The substrate holder can hold substrates of any desired shape. In the present example, the substrate holder has recesses that receive and hold cutting tool inserts 611, which are shown in a top view in FIG. 7. Operation is similar to that previously described, with the gas gap providing the desired heat conduction path between the substrate holder and the cooling block at the desired operating temperatures to handle the heat flux into the substrates and substrate holder. In the various embodiments hereof, it will be understood that a suitable substrate holder may be substituted for an illustrated substrate, or vice versa.

Figure 8:
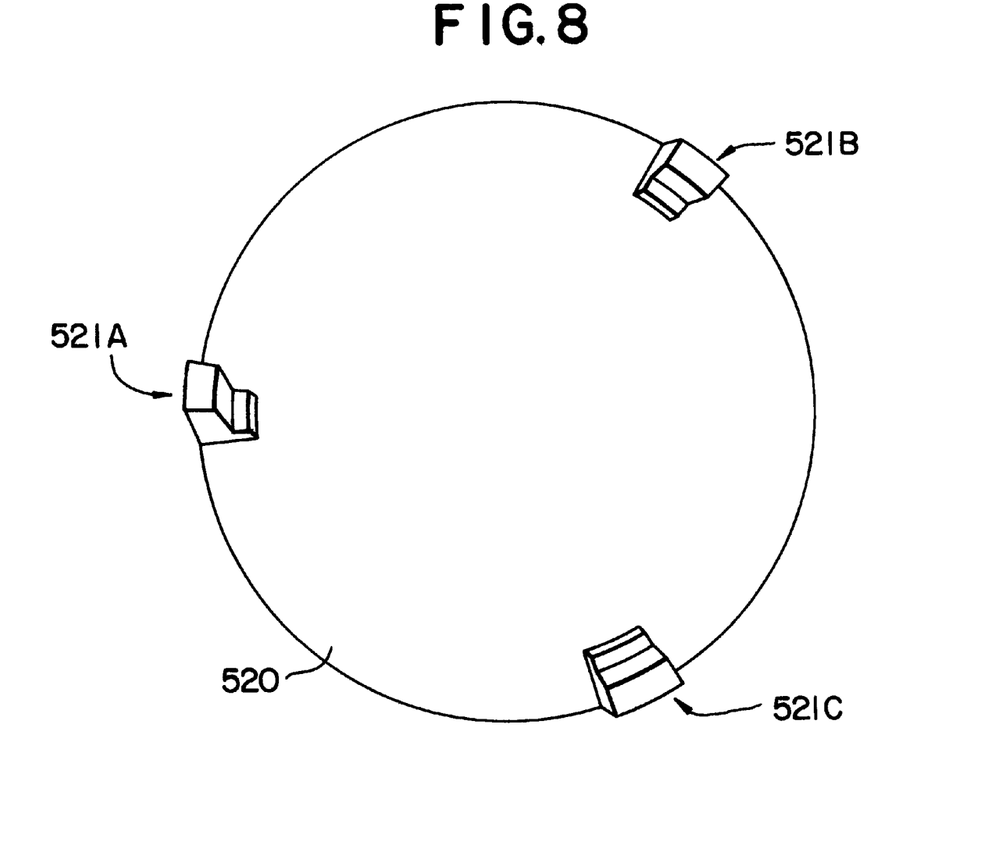
FIG. 8 is top view of a further embodiment of the invention.
Figure 9:
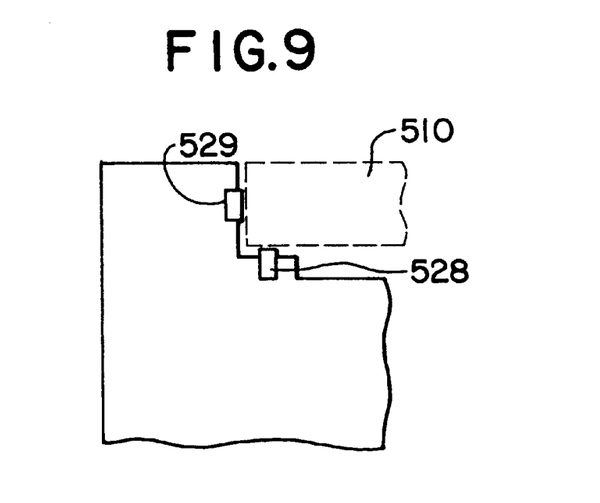
FIG. 9 is a cross-sectional partially broken away view which illustrates a further feature of the invention.

FIG. 8 shows, in a top view, that only three small sections of the two-tiered annular ridge 521 of the FIG. 5 or FIG. 6 embodiment need be utilized to hold the substrate. The three annular ridge sections, 521A, 521B, and 521C act as a frame that contacts the substrate or substrate holder over less area, to minimize thermal conduction from the substrate to the cooling block through the solid structure. As illustrated in the variation of FIG. 9, the shoulder of each ridge can be provided with a pin 528 and pad 529, formed, for example, of a thermally insulating material such as a ceramic. The length of the pins 528, which are seated in receiving holes, can be used to adjust the gap standoff.

Figure 10:
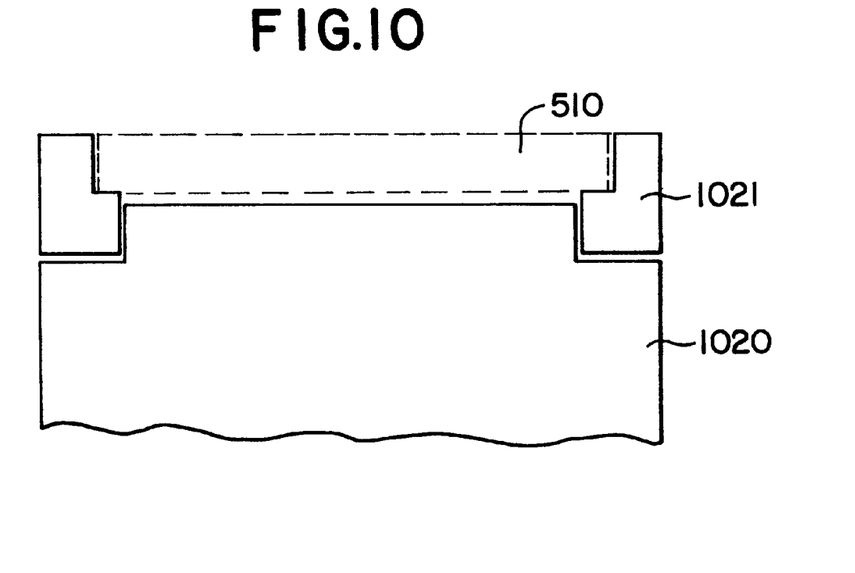
FIG. 10 is a cross-sectional view of a further embodiment of the invention.
Figure 11:
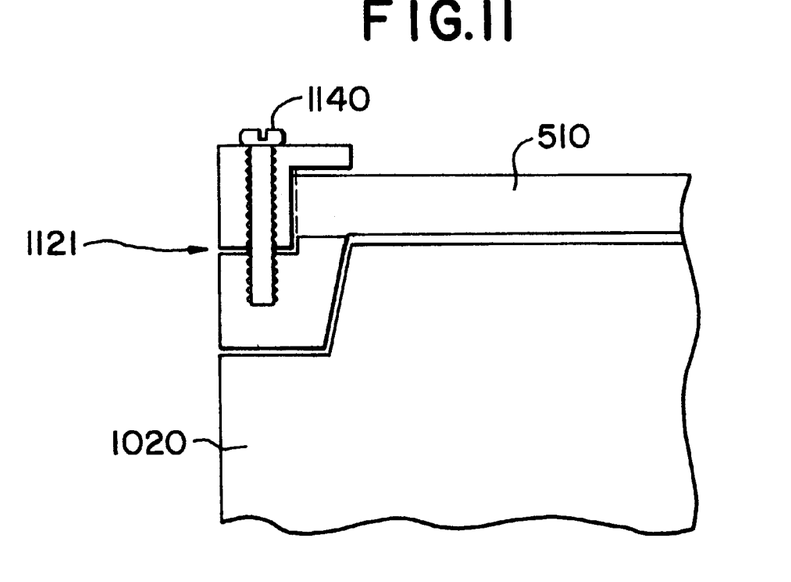
FIG. 11 is a cross-sectional view of a further embodiment of the invention.

In the embodiments of FIGS. 4 through 9 the ridge for supporting the substrate or substrate holder is shown as part of the cooling block. As illustrated in FIGS. 10 and 11, the ridge or frame can be a separate piece or pieces. In FIG. 10, the ridge (or ridge sections) is on a ring 1021 that fits on the matching surface of cylindrical cooling block 1020. Various other configurations are possible. For example, as shown in FIG. 11, the ring or frame can be a two piece construction that holds and secures the substrate with screws 1140. The frame again fits on the cooling block 1020, as shown.

Figure 12:
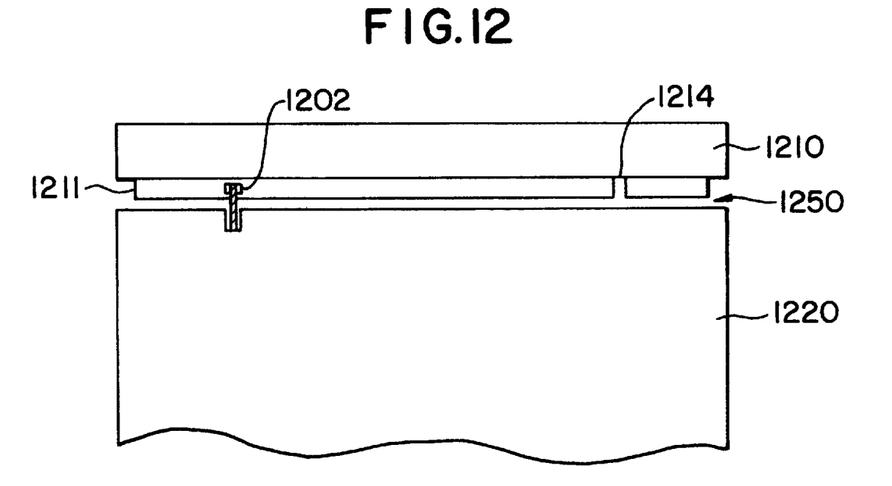
FIGS. 12 and 13 show a further embodiment of the invention wherein a substrate holder is employed in space relation to a cooling block, and the cross-section of FIG. 12 is a section taken through a plane represented by the arrows 12—12 in FIG. 13.
Figure 13:
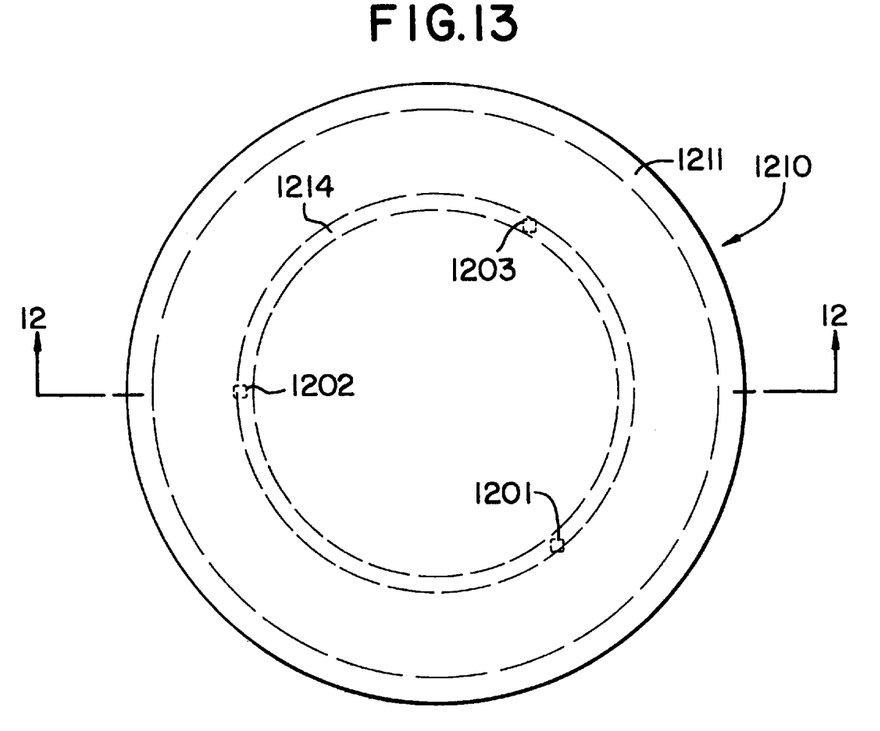

FIGS. 12 and 13 illustrate a further embodiment wherein the cooling block 1220 has three holes equidistant from the center thereof which receive respective pins 1201, 1202 and 1203. The distance of each pin from the center of the cylindrical cooling block corresponds to the radius of an annular groove 1214 in the bottom of a substrate holder 1210, so that when the substrate holder is placed over the cooling block, the pins engage the groove and define the offset of gap 1250. Different pin sizes can be used to obtain different gaps, and the pins can be formed of an insulating material to minimize thermal conduction through the pins. The annular rim shown at 1211 facilitates gripping of the substrate holder with a mechanical arm. If necessary or desirable, the substrate holder can be bolted or clamped in place by means not shown.

Figure 14:
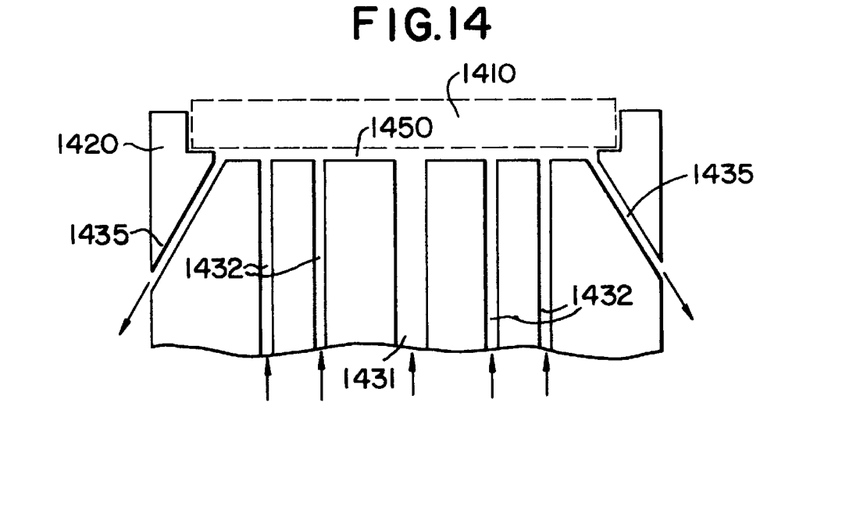
FIG. 14 is a cross-sectional view of a further feature wherein injected gas is utilized.

One or more gases can be injected in the gap to modify the thermal conductivity of the gap temporally and/or spatially. As shown in FIG. 14, the cooling block 1420 (or an attachment thereto, which is considered part of the cooling block for purposes hereof) can include inlet passages such as 1431 and 1432, and outlet passages 1435. A substrate or substrate holder 1410 is mounted as before. A gas can be injected into the inlet passages 1431 and 1432 and exhausted through the outlet passages 1435. If desired, for example, a first gas, such as hydrogen, can be injected through the relatively large central passage 1431, and argon, which has a much lower conductivity than hydrogen, can be injected in a controlled manner into passages 1432 to control thermal conductivity of the gap 1450 as a function of radial position. A spatial variation of the gap thermal conductivity may also be established by varying the thickness of the gap as a function of radial position. (In this regard, see also copending U.S. patent application Ser. No. 08/332,832, now U.S. Pat. No. 5,551,983, assigned to one of the assignees of the present application.)

Figure 15:
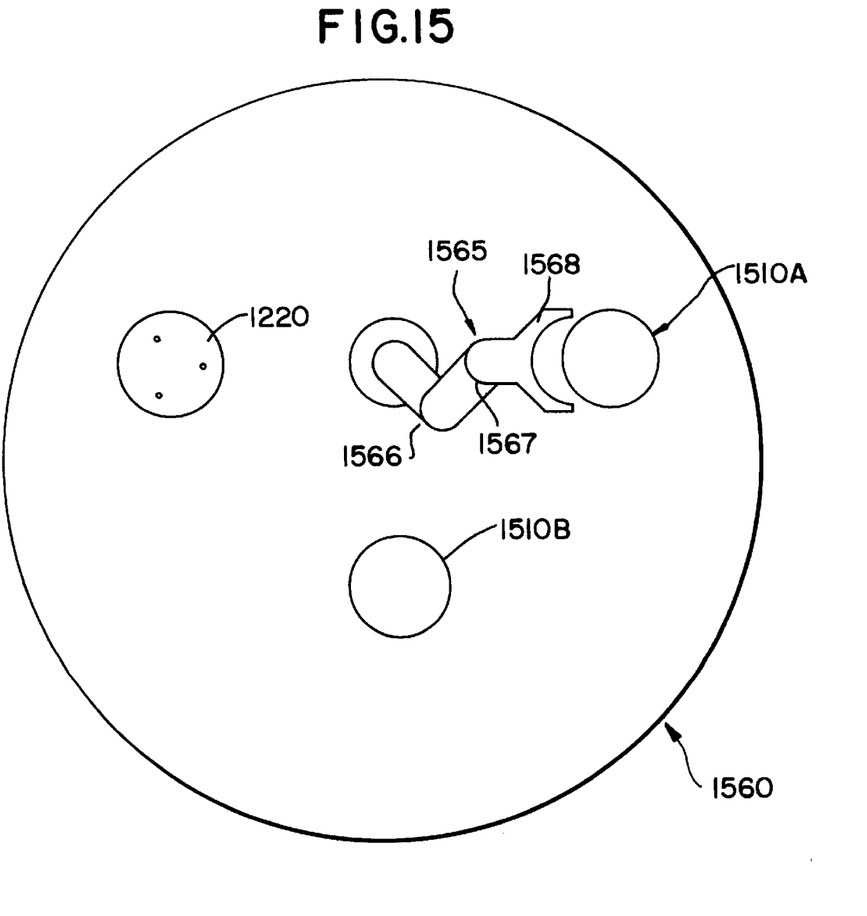
FIG. 15 is a simplified diagram which shows the use of a robot arm in a deposition chamber.

FIG. 15 generally represents a CVD plasma deposition chamber 1560 which may be of the type previously described, and which employs the gas gap feature hereof. The deposition chamber also includes a mechanical arm 1565 (sometimes called a robot arm) that can be controlled from outside the deposition chamber manually, automatically, or semi-automatically, to change substrates or substrate holders without the need for opening the chamber, so that appropriate pressure conditions need not be reestablished from scratch each time a new substrate is put in place. The chamber can be initially provided with a supply of substrates or substrate holders (represented at 1510A) and, after deposition on a substrate (or substrates in a substrate holder) on the cooling block 1220, the robot arm 1565 can be operated to remove the substrate (or substrate holder) from the cooling block 1220, place it aside in the chamber (e.g. at 1510B), take another substrate (or substrate holder with substrates in place), and place it on the cooling block 1220. Deposition can then be implemented, and the substrate moving procedure repeated. If desired, each substrate in the supply can be pre-mounted in a ring structure as in FIG. 11, so that the robot arm will handle the ring structure rather than the substrate itself. The robot arm 1565 can be of known type, which is articulated with an elbow 1566 and wrist 1567, and which engages and releases workpieces with a fork 1568. As is known in the art, the robot arm, the supply of substrates, and/or other items can be in one or more auxiliary chambers, which can be considered as part of the main chamber for purposes hereof. Also, a so-called "load lock" and/or any suitable valving arrangement can be used, as is known in the robotics art.

The invention has been described with reference to particular preferred embodiments, but variations within the spirit and scope of the invention will occur to those skilled in the art. For example, the invention is applicable to various other type of deposition equipment. Also, while circular and disc shaped configurations, and planar surfaces are most typical, the invention can be applied in configurations and contours.

What is claimed is:

1. Apparatus for depositing synthetic diamond on a surface of a substrate, comprising:
   a deposition chamber;
   a cooling block having a surface in said deposition chamber that is cooled by heat exchange;
   means in said deposition chamber for supporting said substrate from said cooling block so that the bottom surface of said substrate is spaced from said cooling block surface by a gap, the size of said gap being in the range 0.01 centimeters to 0.30 centimeters;
   a gas in said deposition chamber and in said gap, said gas comprising at least 30 percent hydrogen gas; and
   plasma deposition means for forming in said chamber a plasma containing hydrogen gas and a hydrocarbon gas in the region of the top surface of said substrate to deposit synthetic diamond on said top surface of said substrate.

2. Apparatus as defined by claim 1, wherein at least 90 percent of the bottom surface of said substrate is spaced from and opposes said cooling block.

3. Apparatus as defined by claim 2, wherein said means for supporting said substrate from said cooling block comprises means for supporting the periphery of said substrate.

4. Apparatus as defined by claim 3, wherein said means for supporting the periphery of said substrate comprises a plurality of pins seated in said cooling block.

5. Apparatus as defined by claim 1, wherein said means for supporting said substrate from said cooling block comprises means for supporting the periphery of said substrate.

6. Apparatus as defined by claim 1, wherein said means for supporting said substrate from said cooling block comprises a frame that is removably mountable on said cooling block.

7. Apparatus as defined by claim 1, further comprising a robot arm in said deposition chamber for changing a substrate supported in said chamber.

8. Apparatus for depositing synthetic diamond on a substrate in the top surface of a substrate holder, comprising:
   a deposition chamber;
   a cooling block having a surface in said deposition chamber that is cooled by heat exchange;
   means in said deposition chamber for supporting said substrate holder from said cooling block so that the bottom surface of said substrate holder is spaced from said cooling block surface by a gap, the size of said gap being in the range 0.01 centimeters to 0.30 centimeters;
   a gas in said deposition chamber and in said gap, said gas comprising at least 30 percent hydrogen gas; and
   plasma deposition means for forming in said chamber a plasma containing hydrogen gas and a hydrocarbon gas in the region of the top surface of said substrate holder to deposit synthetic diamond on said substrate.

9. Apparatus as defined by claim 8, wherein at least 90 percent of the bottom surface of said substrate holder is spaced from and opposes said cooling block.

10. Apparatus as defined by claim 9, wherein said means for supporting said substrate holder from said cooling block comprises means for supporting the periphery of said substrate holder.

11. Apparatus as defined by claim 10, wherein said means for supporting the periphery of said substrate holder comprises a plurality of pins seated in said cooling block.

12. Apparatus as defined by claim 8, wherein said means for supporting said substrate holder from said cooling block comprises means for supporting the periphery of said substrate holder.

13. Apparatus as defined by claim 8, wherein said means for supporting said substrate holder from said cooling block comprises a frame that is removably mountable on said cooling block.

14. Apparatus as defined by claim 13, wherein said frame supports the periphery of said substrate holder.

15. Apparatus as defined by claim 8, further comprising a robot arm in said deposition chamber for changing a substrate holder supported in said chamber.

* * * * *